(12) United States Patent
Wang et al.

(10) Patent No.: US 10,793,944 B2
(45) Date of Patent: Oct. 6, 2020

(54) PERPENDICULAR RECORDING MEDIA WITH ENHANCED ANISOTROPY THROUGH ENERGY ASSISTED SEGREGATION

(71) Applicant: Seagate Technology LLC, Cupertino, CA (US)

(72) Inventors: Chun Wang, Fremont, CA (US);
Connie Liu, San Jose, CA (US);
Thomas P. Nolan, Fremont, CA (US);
Kueir-Weei Chour, San Jose, CA (US)

(73) Assignee: Seagate Technology LLC, Fremont, CA (US)

( * ) Notice: Subject to any disclaimer, the term of this patent is extended or adjusted under 35 U.S.C. 154(b) by 539 days.

(21) Appl. No.: 14/970,809

(22) Filed: Dec. 16, 2015

(65) Prior Publication Data

US 2016/0099020 A1   Apr. 7, 2016

Related U.S. Application Data

(63) Continuation of application No. 13/844,703, filed on Mar. 15, 2013, now abandoned.

(51) Int. Cl.

| C23C 14/00 | (2006.01) |
|---|---|
| C23C 14/06 | (2006.01) |
| C23C 14/08 | (2006.01) |
| C23C 14/34 | (2006.01) |
| C23C 14/54 | (2006.01) |
| G11B 5/65 | (2006.01) |

(Continued)

(52) U.S. Cl.
CPC ........ *C23C 14/0084* (2013.01); *C23C 14/067* (2013.01); *C23C 14/08* (2013.01); *C23C 14/083* (2013.01); *C23C 14/087* (2013.01); *C23C 14/345* (2013.01); *C23C 14/541* (2013.01); *G11B 5/65* (2013.01); *G11B 5/84* (2013.01); *G11B 5/851* (2013.01)

(58) Field of Classification Search
CPC ..... C23C 14/08; C23C 14/083; C23C 14/087; C23C 14/067; C23C 14/541; C23C 14/345; C23C 14/0084; G11B 5/84; G11B 5/65; G11B 5/851
See application file for complete search history.

(56) References Cited

U.S. PATENT DOCUMENTS

| 6,537,684 B1 | 3/2003 | Doerner et al. |
|---|---|---|
| 6,962,648 B2 | 11/2005 | Nagashima et al. |

(Continued)

FOREIGN PATENT DOCUMENTS

| JP | 02308419 A | * 12/1990 |
|---|---|---|
| JP | 05159290 A | * 6/1993 |

OTHER PUBLICATIONS

Machine Translation JP05159290A (Year: 1993).*

*Primary Examiner* — Michael A Band
(74) *Attorney, Agent, or Firm* — Hall Estill Attorneys at Law

(57) ABSTRACT

Apparatus for recording data and method for making the same. In accordance with some embodiments, a magnetic layer is supported by a substrate and comprises a magnetic magnetic material, a non-magnetic material, and an energy assisted segregation material. The segregation material enhances segregation of the non-magnetic material into grain boundaries within the layer at an elevated, moderate energy level.

14 Claims, 5 Drawing Sheets

(51) Int. Cl.
  *G11B 5/84*    (2006.01)
  *G11B 5/851*   (2006.01)

(56) References Cited

U.S. PATENT DOCUMENTS

| | | | |
|---|---|---|---|
| 7,323,259 | B2 | 1/2008 | Chen et al. |
| 7,384,699 | B2* | 6/2008 | Nolan ................... G11B 5/656 |
| | | | 428/829 |
| 7,504,166 | B2* | 3/2009 | Chen ....................... G11B 5/66 |
| | | | 428/827 |
| 8,351,309 | B2 | 1/2013 | Kanbe et al. |
| 2003/0235714 | A1 | 12/2003 | Koda et al. |
| 2005/0153169 | A1 | 7/2005 | Wantanabe et al. |
| 2005/0181237 | A1 | 8/2005 | Kitakami et al. |
| 2006/0121319 | A1 | 6/2006 | Wu et al. |
| 2007/0048488 | A1 | 3/2007 | Fuji et al. |
| 2007/0064345 | A1 | 3/2007 | Nolan et al. |
| 2011/0002064 | A1 | 1/2011 | Nakagawa et al. |
| 2012/0026627 | A1* | 2/2012 | Wu .......................... G11B 5/66 |
| | | | 360/135 |
| 2012/0251846 | A1 | 10/2012 | Desai et al. |
| 2012/0300600 | A1 | 11/2012 | Kanbe et al. |
| 2013/0034748 | A1 | 2/2013 | Ishio et al. |

\* cited by examiner

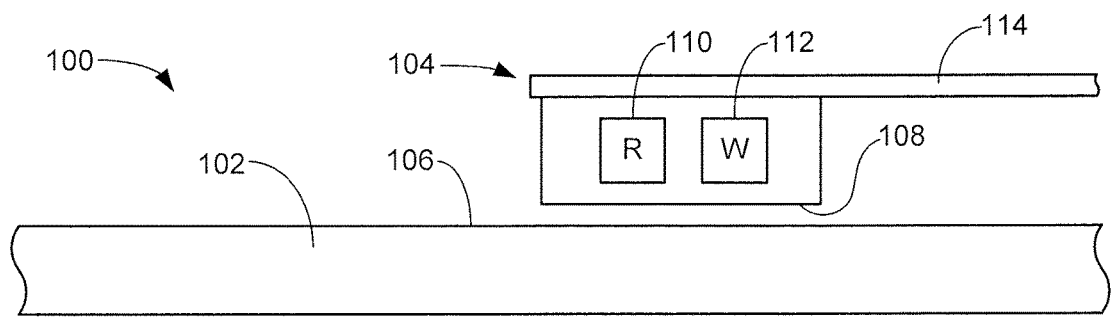
FIG. 1
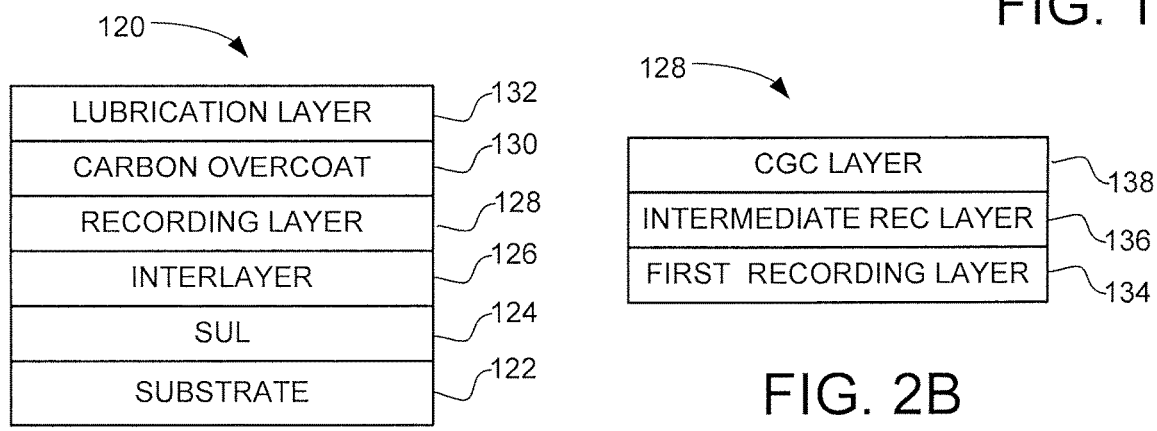
FIG. 2A
FIG. 2B
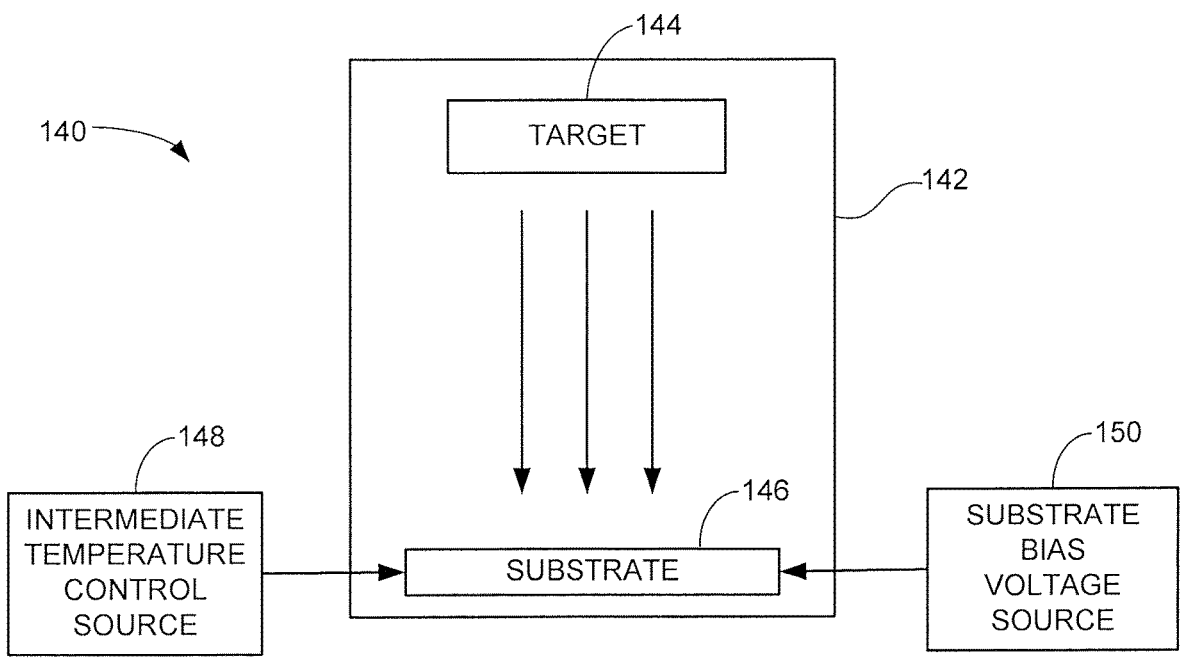
FIG. 3

PERPENDICULAR RECORDING MEDIA WITH ENHANCED ANISOTROPY THROUGH ENERGY ASSISTED SEGREGATION

RELATED APPLICATION

This application is a divisional of copending U.S. patent application Ser. No. 13/844,703 filed on Mar. 15, 2013.

SUMMARY

Various embodiments of the present disclosure are generally directed to an apparatus for recording data and method for making the same.

In accordance with some embodiments, a magnetic layer is supported by a substrate and comprises a magnetic material, a non-magnetic material, and an energy assisted segregation enhancement material. The segregation enhancement material is adapted to enhance segregation of the non-magnetic material into grain boundaries within the layer at an elevated, moderate energy level.

These and other features of various embodiments can be understood from a review of the following detailed description in conjunction with the accompanying drawings.

BRIEF DESCRIPTION OF DRAWINGS

FIG. 1 shows a data recording system in accordance with some embodiments.

FIG. 2A shows a data storage medium in accordance with some embodiments.

FIG. 2B shows a format for the recording layer of FIG. 2A in accordance with some embodiments.

FIG. 3 shows a hybrid deposition/separation processing system used in accordance with some embodiments to form media such as depicted in FIG. 2.

DETAILED DESCRIPTION

Figure 4:
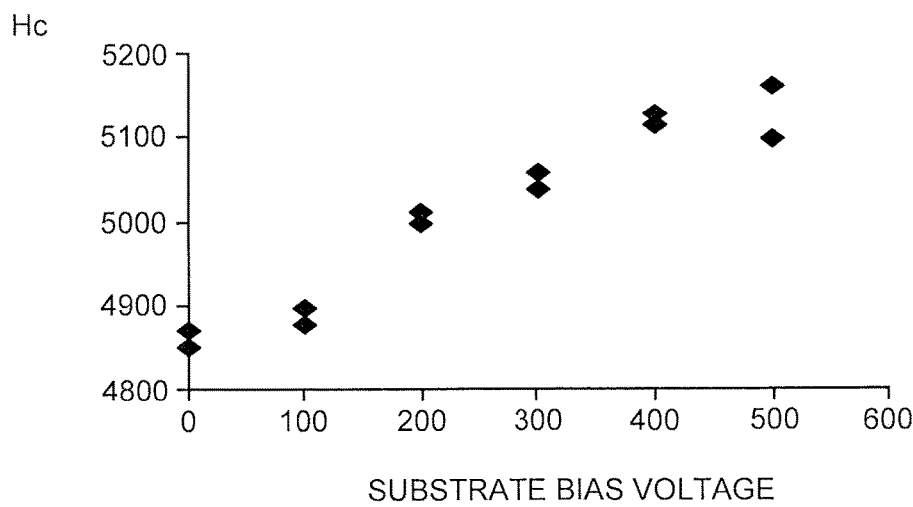
FIG. 4 graphically illustrates coercivity versus substrate bias voltage data.

The present disclosure is generally directed to perpendicular data recording systems. In a perpendicular recording system, a magnetic sequence is written to a recording structure of a medium such that the magnetization axes of the bits are in a direction generally perpendicular to the plane of the recording layers. This is in contrast to longitudinal recording media solutions, which provide bits with net magnetization in a direction substantially parallel to the direction of rotational movement.

A perpendicular recording medium can take a variety of forms. Some common configurations include a substrate, a soft underlayer (SUL), one or more intermediate layers, one or more magnetic recording layers, and a protective carbon overcoat (COC). A layer of lubricant may be applied to the COC to reduce damage from contact between the medium and a read/write transducer used to record and read data back from the medium.

The magnetic recording layers may take a variety of forms such as polycrystalline CoPtCr or CoPt-oxide containing films. Co-rich areas in the polycrystalline films are ferromagnetic, and the Cr, and/or oxide rich areas are non-ferromagnetic (hereinafter non-magnetic) or more weakly magnetic. The magnetic interaction between adjacent ferromagnetic domains is attenuated by the non-magnetic areas in between.

It is desirable to precisely control the microstructure and magnetic properties of a perpendicular recording medium to support high density, low noise data recording. Efforts are often made to form magnetic layers with uniform and small grain sizes, well-controlled magnetic decoupling between adjacent grains, high magnetic anisotropy, high packing fraction and narrow grain boundaries. These features can provide media with high signal strength, high thermal stability and good corrosion resistance characteristics.

In some prior art longitudinal designs, magnetic recording layers were formed by depositing a CoCr alloy at high temperature, such as between about 230-300° C., so as to enable diffusion of the non-magnetic Cr to the grain boundaries of the magnetic Co and decouple the grains. In some cases, multiple elements including Ta and B were added to increase the Cr diffusion during this high temperature deposition processing.

The foregoing approach is less suitable for the formation of perpendicular recording media. The required perpendicular magnetic easy axis and corresponding perpendicular c-axis of the hcp Co-alloys make them more prone to stacking faults that reduce magnetic anisotropy of the material. The higher magnetic anisotropy, and smaller grain sizes required by perpendicular recording media are difficult to achieve using high temperature CoCr alloy deposition due to a number of issues, including growth stacking faults which are compounded by the addition of Ta and B. Thus, while high temperature CoCr alloy deposition and diffusive Cr segregation may be operative, it has been found to be difficult to use high temperature deposition to simultaneously achieve the requisite grain sizes, magnetic anisotropy energies and high amount of segregation and high segregant concentration gradients required to support current and future data recording density requirements.

A more recent process used in the art to form thin film magnetic recording layers is sometimes referred to as granular oxide segregation. Rather than being carried out at high temperature, granular oxide segregation is generally carried out at ambient room temperature (e.g., about 20° C.) and involves depositing a magnetic material and a non-magnetic oxide compound such as silicon dioxide (SiO2) or titanium dioxide (TiO2). The non-magnetic oxide may also comprise an oxide formed by reactive sputtering with a sputter gas containing oxygen atoms. The segregation process in this low temperature deposition process is not so much a diffusion process as it is a preferential stacking process, as the oxide does not "stick" well to the metal and instead is accumulated in "valley" regions between the magnetic material. Subsequently the oxide sticks preferentially to itself, forming the segregated oxide rich material that becomes the grain boundaries.

This segregation mechanism requires relatively low substrate temperature and adatom energies to form nano roughness and "valleys", and take advantage of disparate "sticking" coefficients; and becomes decreasingly effective as temperature is increased toward that used in the previously described Cr diffusion process.

While supporting higher data densities, granular oxide segregation can have a number of limitations. Increasing the amount of oxide to reduce exchange coupling to a desired level can tend to make the magnetic layer more porous, degrades the grain boundary density, and lowers the packing density. Magnetic anisotropy, magnetic moment, thermal stability levels, mechanical toughness and corrosion resistance are all reduced. These problems are exacerbated by further increases in areal data density and higher anisotropy requirements.

Accordingly, various embodiments of the present disclosure are generally directed to an improved thin film magnetic layer and method for making the same. As explained below, in some embodiments a hybrid deposition process is employed wherein a granular oxide material such as a CoCr oxide containing material is deposited along with a segregation enhancement element (SEE) in a process that employs energy assisted segregation (EAS).

The EAS processing supplies an elevated, moderate energy level during the deposition processing. The elevated, moderate energy level is generally lower than that supplied in conventional high temperature deposition processing, and is generally higher than in convention granular oxide segregation processing. In some embodiments, the elevated, moderate energy level is supplied by performing the processing at intermediate temperature levels such from about 100° C. to about 200° C. Additionally or alternatively, a substrate voltage bias level can be provided such as in the range of from about 0V to about 500V or more.

The segregation enhancement element, also referred to as a segregation enhancement material (e.g. B) assists the diffusion of a non-magnetic segregation material (e.g., Cr) to increase Cr segregation at lower temperatures to form the magnetic grains with reduced exchange coupling between grains. The segregation enhancement element thus enables magnetic decoupling by segregation of Cr at temperature where granular oxide segregation is also still active. The segregation enhancement element combined with energy assisted segregation process thus enables achieving the same total segregation and magnetic decoupling, but with reduced content of the deposited oxide segregant material in the grain boundaries as compared to a granular oxide process, thereby reducing porosity and enhancing density, anisotropy, etc.

While magnetic recording layers are contemplated, the processing can be applied to other layers as well, such as but not limited to non-magnetic interlayers or seed layers. These and other features of various embodiments can be understood beginning with a review of FIG. 1, which shows an exemplary data recording system 100. The system 100 includes a rotatable perpendicular magnetic data recording medium 102 and an adjacent data transducer 104.

Generally, the medium 102 and the transducer 104 may be incorporated into a hard disc drive (HDD) or other data storage device wherein multiple axially arranged recording media (discs) and data transducers are used to record and retrieve user data.

In some embodiments, the data are stored on the medium 102 along a number of concentric tracks (not shown) defined along a surface 106 of the medium. The data may be stored in the form of addressable user data sectors of fixed size along the tracks. Hydrodynamic features (such as an air bearing surface 108) may be provisioned on a facing surface of the transducer 104 to enable the transducer to be fluidically supported in close proximity to the medium surface 106 by atmospheric currents established during rotation of the medium 102.

The data transducer 104 is shown to include respective read (R) and write (W) 110, 112. The read element 110 may take the form of a magneto-resistive (MR) sensor. The write element 112 may include a write coil and one or more magnetically permeable cores.

During a data read back operation, the read element 110 operates to sense a magnetization sequence written to the medium 102 along a portion of a selected track. During a data recording operation, the write element 112 directs magnetic flux into the recording structure of the medium 102.

The system of FIG. 1 can be readily adapted for a heat assisted magnetic recording (HAMR) application wherein electromagnetic radiation impinges the recording area to assist the recording process. In other applications, the media may be configured as so-called ECC+CGC (exchange coupled composite+continuous granular composite) perpendicular recording media.

FIG. 2A depicts a perpendicular magnetic data recording medium 120 suitable for use in a data recording system such as depicted in FIG. 1. The medium format is merely exemplary as any number of other forms can be used. FIG. 2A shows illustrative layers including a substrate 122, a soft magnetic underlayer (SUL) 124, an interlayer 126, a magnetic recording layer 128, a carbon overcoat (COC) protective layer 130 and a lubrication layer 132. Any number of additional layers can be incorporated including, without limitation, seed layers, additional intermediate layers, domain control layers, antiferromagnetic (AFM) layers, barrier diffusion layers, additional recording layers, etc.

As shown in FIG. 2B, in some embodiments the recording layer 128 takes the form of an ECC+CGC recording layer with a first recording layer 134 with a relatively higher anisotropy, an intermediate recording layer 136 with a relatively lower anisotropy, and a CGC magnetic layer 138. The first recording layer 134 and the intermediate recording layer 136 may be granular layers, and the intermediate recording layer 136 may be characterized as a soft granular layer.

Data are recorded to the magnetic recording layer 128 using a system such as depicted in FIG. 1 in the form of substantially perpendicularly (vertically) magnetized domains. The soft magnetic material of the SUL 124 provides a substantially horizontal return path for the applied magnetic flux.

The magnetic recording layer 128, including one, some or all of the respective layers 134, 136 and 138 in FIG. 2B, can be formed using a hybrid deposition/separation processing system 140 as shown in FIG. 3. The system 140 deposits a granular oxide material along with a segregation enhancement element (SEE) while employing energy assisted segregation (EAS). The system enables the SEE, also referred to as an energy assisted segregation material, to enhance segregation of the non-magnetic material into grain boundaries within the layer at an elevated, moderate energy level. It will be appreciated that segregation of the non-magnetic material into grain boundaries correspondingly allows the magnetic material to be segregated into grains.

The system 140 comprises a deposition chamber 142 which encloses a target 144 and a substrate 146. The target 144 may include CoPtCr-oxide along with B (or other SEE). The target materials are sputtered onto the substrate 146. An intermediate temperature control source 148 heats the substrate 146 to an intermediate temperature. The heating of the substrate may take place prior to placement of the substrate into the chamber 142.

The EAS is carried out at moderate energy levels supplied by the heating of the substrate by the source 148 and/or the application of bias voltage to the substrate 146 by a substrate bias voltage source 150. In some embodiments, the substrate 146 is maintained at a temperature in a range of from about 100° C. to about 200° C. In other embodiments, the substrate 146 is maintained at a temperature of about 150° C. In other embodiments, the substrate 146 is maintained at a temperature at about 190° C. In still other embodiments, the substrate 146 is maintained at a temperature in a range of from about 25° C. to about 220° C.

The substrate bias voltage source 150 may apply a substrate voltage of from about 0V to about 500V. The particular temperature and bias voltage levels can be selected based on the requirements of a given application. Without limitation, parametric combinations may include (but are not limited to) a temperature of less than about 100° C. and a bias voltage magnitude of 200V or more; a temperature of 150° C. and a bias voltage magnitude of 0V or more; or a temperature of about 200° C. and a bias voltage magnitude of 200V or less.

The respective proportions of the magnetic material, the oxide and the diffusion based segregation element can vary depending on the application and may be empirically determined. Suitable energy levels (e.g., temperature and/or bias) for each application can similarly be empirically determined. In some embodiments, relatively high atmospheric pressure using a suitable element (e.g., Ar) can be maintained within the chamber to enhance particle scattering in the plasma to provide variable deposition direction and surface "roughness" during early stages of the deposition process.

The amount of segregation enhancement material can also be tuned, so that greater and/or lesser amounts of the element are provided. The tuning may also be changed at different stages of the deposition, as the substrate temperature and other energy assist mechanisms alter the sputter kinetics. For example, in some embodiments a relatively greater amount of the segregation enhancement element is introduced at the beginning stages of the energy assisted segregation processing to initiate the non-magnetic (e.g., Cr, B, and oxide) material containing areas, and then subsequently amounts of the segregation enhancement materials are reduced as the non-magnetic areas grow in size.

In other embodiments, the amount of Cr and B may be increased or reduced relative to the amount of oxide segregant as the amount of energy assist is changed, or as the recording layer density requirement changes. For example, higher film density may be desired to protect the top surface, so the energy assist level might be increased, and the Cr diffusion segregant and B segregant enhancement concentrations might be increased, with reduced oxide segregant to compensate.

At this point it will be observed that the elevated, moderate energy level established as set forth herein facilitates the use of oxides (including reactive oxygen) as part of the deposition process, which generally is undesirable at the higher deposition temperature ranges associated with conventional diffusion processing (e.g., from about 230° C. to about 300° C. or more).

Moreover, the use of the segregation enhancement element (e.g., B) in conjunction with the established moderate energy level facilitates greater diffusion mobility of the primary diffusion segregant material (e.g., Cr) at temperatures lower than this conventional high temperature deposition range. While B is a suitable segregation enhancement element, other non-magnetic, non-oxide elements are contemplated as well such as but not limited to Manganese (Mn) and Tantalum (Ta).

As noted above, the segregation enhancement element (e.g., B) assists the segregation of the non-magnetic material (e.g., Cr) at relatively low temperature to form the magnetic domains with improved exchange coupling between grains. The segregation element further enables the oxide content of the deposited material to be reduced, thereby reducing porosity of the layer and enhancing grain density and magnetic anisotropy. It has been found that using the elevated, moderate energy levels discussed herein provide a thin film with superior physical and magnetic properties to other thin films.

The following performance data graphs of FIGS. 4-14 generally relate to the exemplary processing of FIG. 3 to various recording layers of the medium 120 of FIG. 2. It will be appreciated that the graphs are merely illustrative and that different characteristics may arise for other combinations. Nevertheless, the data in the following figures can be used to illustrate a suitable methodology for selecting appropriate bias voltage magnitude, temperature, and other parameters for a given application.

FIG. 4 provides a graphical representation of media coercivity (Hc) versus bias voltage applied to the substrate during the deposition/segregation process to form a top recording layer with a relatively high anisotropy such as the layer 134 in FIG. 2B. As shown in FIG. 4, media coercivity generally increases with increasing substrate bias voltage, indicating higher anisotropy at high bias. Empirical measurements of some test samples showed application of a bias voltage level of about 350V resulted in an increase of the in-plane anisotropy energy (Ku) of the magnetic recording layer film by about 16%, and an increase of the in-plane coercivity (Hk) by about 3.5%.

Figure 5:
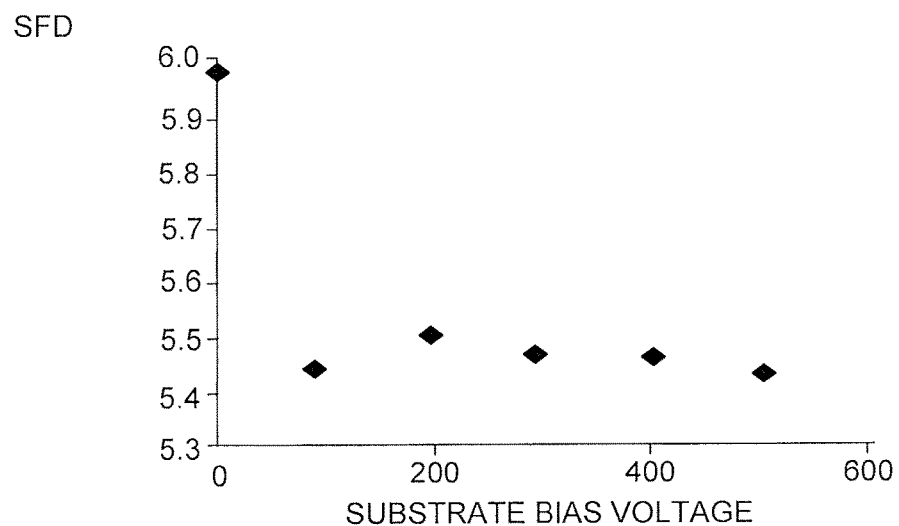
FIG. 5 graphically illustrates switching field distribution versus substrate bias voltage data.

FIG. 5 shows switching field distribution (SFD) versus substrate bias voltage for the layer 134. A smaller SFD generally correlates to a higher intrinsic signal to noise ratio (SNR) for a storage medium if all other structural and magnetic properties are the same. FIG. 5 indicates that SFD improves with the application of some bias voltage, and remains largely constant over a range of from about 200V to about 500V. This provides a large range of bias voltage that can be selected to optimize other thin film physical and/or magnetic parameters while maintaining good SFD.

Figure 6:
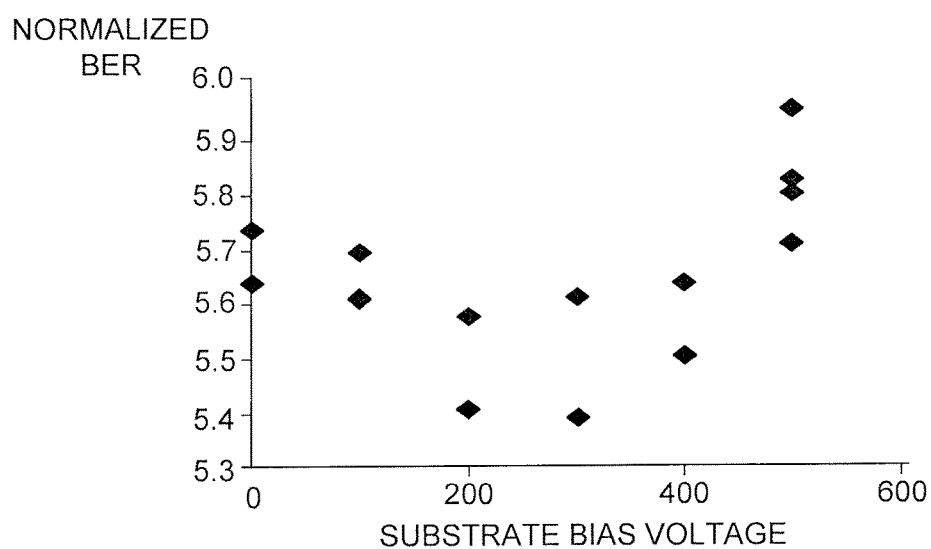
FIG. 6 graphically illustrates areal density versus substrate bias voltage data.
Figure 7:
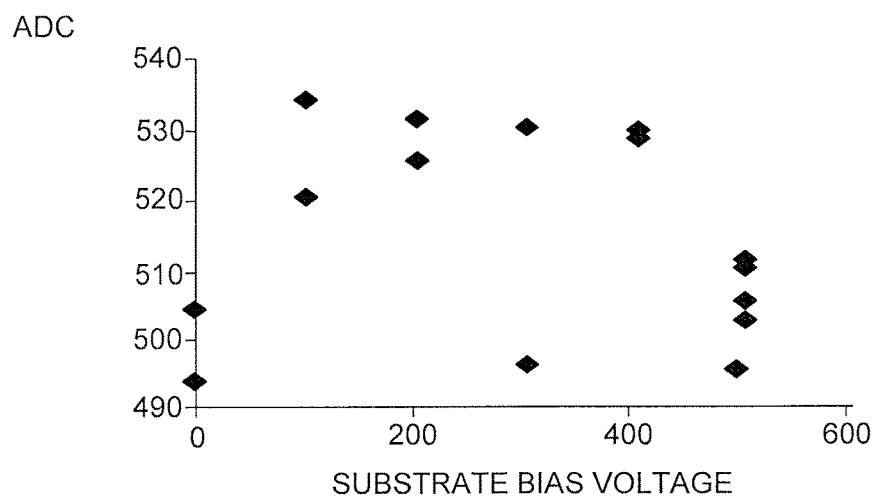
FIG. 7 graphically illustrates normalized bit error rate (BER) versus heater temperature data.

FIG. 6 illustrates normalized bit error rate (BER) performance for different substrate bias voltages applied during fabrication. The samples tested show best BER performance at a substrate bias of about 200-400V. FIG. 7 shows areal density capacity (ADC) measurements versus substrate bias. ADC was also found to be best over a substrate bias range of about 200-400V. Accordingly, from the data in FIGS. 4-7 it can be seen that a suitable bias voltage of about 200-400V might tend to provide acceptable levels of coercivity, SFD, BER and ADC for the exemplary thin film application.

Figure 8:
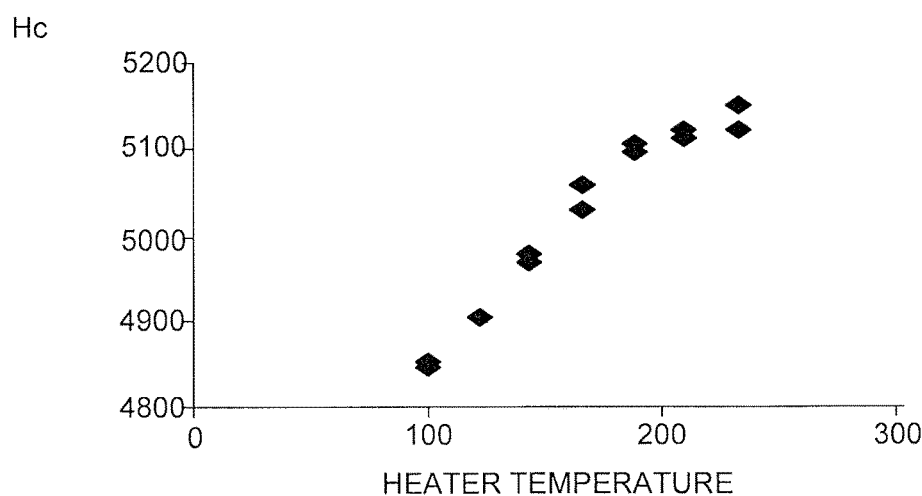
FIG. 8 graphically illustrates coercivity versus heater temperature data.
Figure 9:
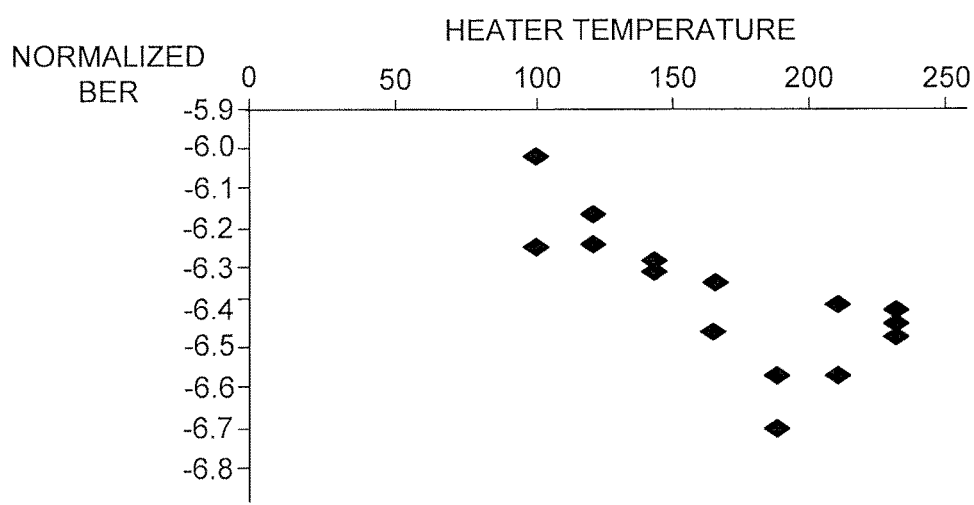
FIG. 9 graphically illustrates normalized BER versus heater temperature data.
Figure 10:
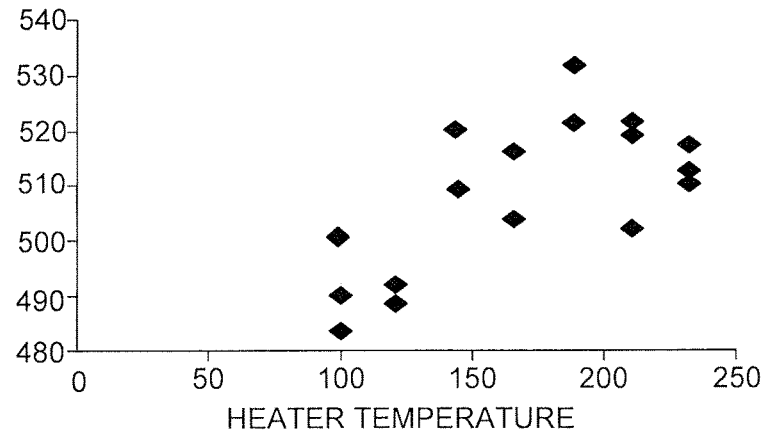
FIG. 10 graphically illustrates areal density versus heater temperature data.

FIGS. 8-10 evaluate the foregoing factors in terms of heater temperature. FIG. 8 shows test data for coercivity (Hc) versus temperature. The coercivity generally increases with increasing heater temperature, which may suggest better crystal growth and Chromium+Boron segregation at higher temperature over the applicable range (e.g., about 100-220° C.).

FIG. 9 shows normalized BER and FIG. 10 shows ADC verses changes in heater temperature. It can be seen that both of these are temperature dependent. When the heater temperature increases to about 190° C., the media BER was reduced and ADC was maximized. It was found that further increases in temperature degraded both BER and ADC.

Figure 11:
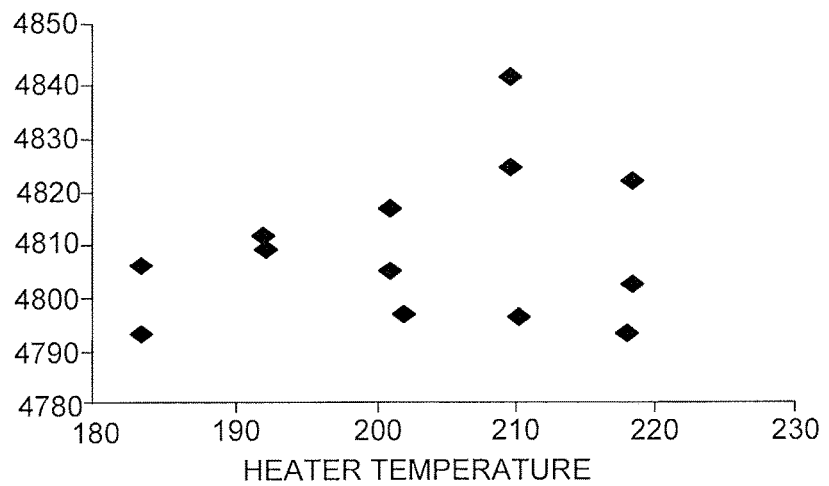
FIG. 11 graphically illustrates coercivity versus heater temperature data.
Figure 12:
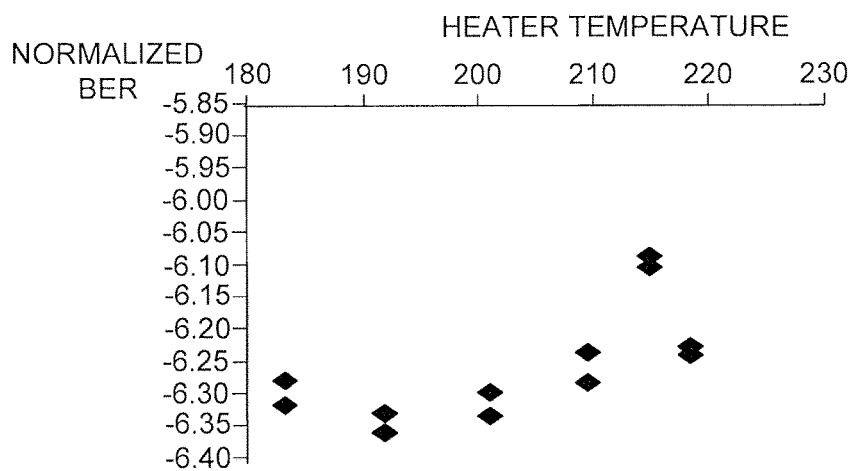
FIG. 12 graphically illustrates normalized BER versus heater temperature data.
Figure 13:
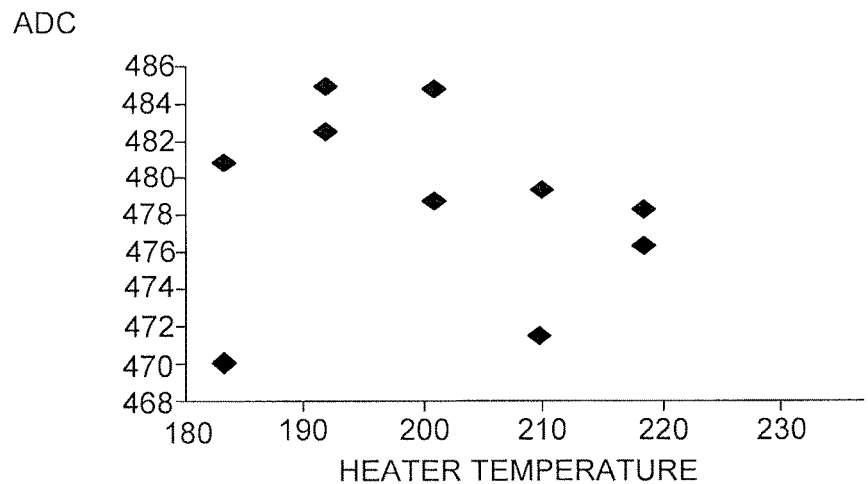
FIG. 13 graphically illustrates areal density versus heater temperature data.

The foregoing data of FIGS. 4-10 depict parametric combinations suitable for forming a magnetic recording layer such as the top magnetic recording layer 134 in FIG. 2B. FIGS. 11-13 provide corresponding graphical data for a soft granular layer such as the intermediate layer 136 in FIG. 2B. From FIG. 11 it can be seen that when Boron is added as a segregation enhancement element, He increases with heater temperature up to a point (such as around 210° C.) and drops when the temperature continues to increase after that.

FIGS. 12-13 show corresponding normalized BER and ADC data for the intermediate layer 136. It can be seen from these graphs that optimal BER and ADC values were obtained using a heater temperature of about 193° C. As before, BER degrades and ADC drops with further increases in temperature.

Each of the foregoing examples illustrate that the use of B as a segregation enhancement element enables diffusion at elevated yet moderate temperature levels, allowing the design and manufacture of a new class of perpendicular recording media at elevated temperature in a range of below about 220° C. The processing as disclosed herein achieves the advantages of both room temperature granular oxide deposition and high temperature diffusion processes while reducing the limitations associated with each.

Figure 14:
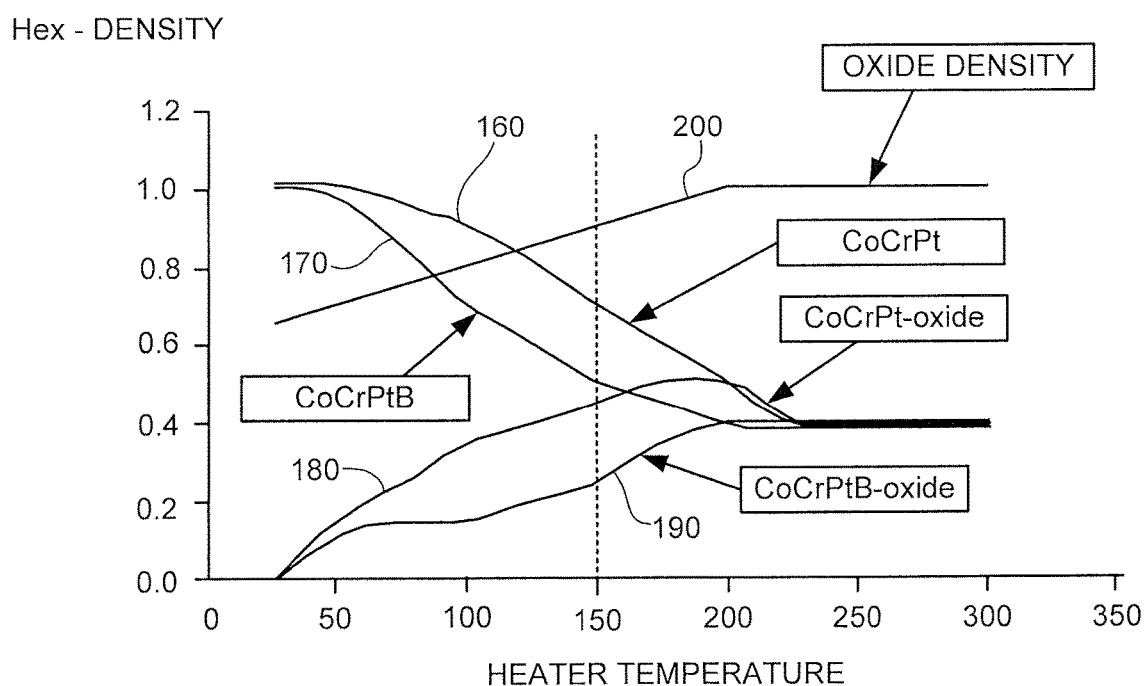
FIG. 14 schematically illustrates exchange coupling and density for a variety of samples of thin film to illustrate some aspects of various embodiments.

FIG. 14 provides a schematic graphical representation of further advantages associated with the processing disclosed herein. FIG. 14 illustrates exchange field and media density characteristics versus heater temperature for a number of different thin film configurations, some with and some without the segregation enhancement element processing set forth above.

Curve 160 depicts the amount of lateral intergranular exchange coupling in a magnetic thin-film layer formed of CoCrPt, and curve 170 shows the amount of lateral intergranular exchange coupling in a film formed of CoCrPtB with the addition of B serving as a segregation enhancement element; both as a function of substrate temperature during film deposition. Similarly, curve 180 depicts the amount of lateral intergranular exchange coupling in a thin film of CoCrPt-oxide, and curve 190 shows the amount of lateral intergranular exchange coupling in a film of CoCrPtB-oxide with B as the segregation enhancement element. Curve 200 indicates metal layer density.

The CoCrPt film (curve 160) represents a CGC magnetic recording layer, such as the layer 138 in FIG. 2B. The CoCrPt-oxide (curve 180,) represents a granular layer, such as one or both of the layers 134, 136 in FIG. 2B. As shown in FIG. 14, the addition of Boron to a CGC layer (curve 170), when constructed as a CoCrPtB compound, or to a granular layer (190), when formed as a CoCrPtB-oxide, decreases exchange field observed at an intermediate temperature range such as around 150° C.

Comparing the exchange coupling of the CGC layer with the use of B as the segregation enhancement element (curve 170) to that of CGC layer without the segregation enhancement element (curve 160), it can be seen that exchange coupling is high at low temperature, and decreases as temperature increases, owing to diffusion of Cr (and B in the layer with the segregation enhancement layer). It can also be seen that the segregation and exchange reduction begin at lower substrate temperature (or bias) for the material with the segregation enhancement element (curve 170).

Exchange coupling of the oxide materials shows the opposite trends. Comparing the granular layer without B (curve 180) with the granular layer with B (curve 190), the lowest exchange coupling is at low temperature and bias, and exchange increases as the oxide segregation becomes less effective at higher temperature. The exchange continues to increase until the temperature is sufficient that Cr diffusion becomes the dominant segregation mechanism above about 200 C.

The conventional oxide granular recording layer material 180 provides a desirably low exchange value (e.g., 0.25) at a low temperature consistent with no substrate heating, but film density is low in this case. Oxide material with the segregation enhancement element 190 achieves a similarly low exchange value (e.g., 0.25) at a an intermediate temperature (~150 C) by combining the improved diffusion based decoupling of Cr and B that provides the exchange difference between curves 160 and 170, with the oxide decoupling of curve 180. The result is that the material with oxide, Cr, and the segregation enhancement element (B) provides coupling as low as the conventional oxide material, but at an intermediate temperature, for example, about 150° C., where the film density is much higher than the conventional material; and thus mechanical properties as well as grain uniformity and SFD are improved by the narrow dense grain boundaries that correspondingly provide larger more uniform grain cores.

It will now be appreciated that the deposition process employing a segregation enhancement element (SEE) and energy assisted segregation (EAS) as disclosed herein can provide a number of benefits. In some cases a multilayer magnetic recording structure can be provided where each magnetic recording layer is deposited using the SEE/EAS process under different process parameters to achieve the desired characteristics. In other cases, some layers, such as the intermediate layer 136 in FIG. 2B, may be formed using the disclosed SEE/SEA processing and other layers such as the top layer 134 may be formed using a different process.

Numerous characteristics and advantages of various embodiments of the present disclosure have been set forth in the foregoing description, together with structural and functional details. Nevertheless, this detailed description is illustrative only, and changes may be made in the details, especially in matters of structure and arrangements of parts, within the principles of the present disclosure, to the full extent indicated by the broad general meaning of the terms wherein the appended claims are expressed.

What is claimed is:

1. A method comprising depositing on a substrate a perpendicular magnetic recording layer comprising respective amounts of a magnetic material comprising cobalt (Co), a non-magnetic material comprising Chromium (Cr), an oxide and an energy assisted segregation material comprising Boron (B) at an elevated, moderate energy level comprising a substrate temperature of from about 100° C. to about 150° C. and a substrate voltage magnitude of from above 0V to about 500V, wherein during said depositing of the magnetic recording layer a sputtering process is used while maintaining the substrate temperature and the substrate voltage magnitude such that the amount of the energy assisted segregation material relative to the amount of the magnetic material, the non-magnetic material and the oxide is adjusted to enhance segregation of the non-magnetic material into grain boundaries within the magnetic recording layer, and wherein said depositing of the magnetic recording layer comprises depositing a greater first amount of the energy assisted segregation material on the substrate at a beginning of the depositing of the magnetic recording layer to initiate formation of non-magnetic areas of the magnetic recording layer, and subsequently depositing a reduced second amount of the energy assisted segregation material on the substrate as the non-magnetic areas grow in size.

2. The method of claim 1, wherein the magnetic recording layer is a continuous granular composite (CGC) layer.

3. The method of claim 1, wherein the substrate temperature is about 150° C.

4. The method of claim 1, wherein the magnetic recording layer is deposited upon the substrate within a chamber, and wherein the method further comprises applying a pressurized atmosphere within the chamber at a pressure greater than one atmosphere during the depositing of the magnetic recording layer.

5. The method of claim 1, wherein the bias voltage is from about 200V to about 400V.

6. A method for forming a perpendicular recording media, comprising:
   placing a substrate into a chamber;
   heating the substrate to a temperature of from 100° C. to 150° C.;
   applying a voltage to the substrate greater than 0V and less than or equal to 500V;
   providing a target within the chamber having a magnetic material comprising Cobalt (Co), a non-magnetic material comprising Chromium (Cr), an oxide and an energy assisted segregation material comprising Boron (B); and
   using the target for depositing a magnetic recording layer by sputtering onto the substrate, the magnetic recording layer comprising the magnetic material arranged as grains separated by the non-magnetic material and the oxide, the energy assisted segregation material enhancing separation of the magnetic material from the non-magnetic material responsive to the heating of the substrate and the applying of the voltage to the substrate, wherein during the depositing of the magnetic layer onto the substrate the heating of the substrate and the applying of the voltage to the substrate are maintained, such that a greater first amount of the energy assisted segregation material is used at a beginning of the depositing of the magnetic recording layer to initiate formation of non-magnetic areas of the magnetic recording layer, and a reduced second amount of the energy assisted segregation material is used during continued depositing of the magnetic recording layer onto the substrate as the non-magnetic areas grow in size.

7. The method of claim 6, wherein the voltage applied to the substrate has a magnitude of 200V or less.

8. The method of claim 6, wherein the substrate temperature is about 150° C.

9. The method of claim 6, wherein the bias voltage is from about 200V to about 400V.

10. A method for forming a perpendicular magnetic recording layer on a substrate, the method comprising steps of:
    placing the substrate into a chamber;
    heating the substrate to a temperature of from 100° C. to 150° C.;
    applying a voltage to the substrate having a magnitude of from above 0V to 500V;
    providing a target within the chamber with a target material comprising Co, Pt, Cr, an oxide and B where B is characterized as an energy assisted segregation material; and
    sputtering the target material to deposit onto the substrate to form the magnetic recording layer, the magnetic recording layer separated into magnetic grains and non-magnetic boundaries by the energy assisted segregation material responsive to the heating of the substrate and the applying of the voltage to the substrate, wherein during the sputtering of the target material onto the substrate the heating of the substrate and the applying of the voltage to the substrate are maintained, such that a greater first amount of the energy assisted segregation material is used at a beginning of the sputtering of the substrate to initiate formation of the non-magnetic boundaries of the magnetic recording layer, and a reduced second amount of the energy assisted segregation material is used during continued sputtering of the substrate as the non-magnetic boundaries grow in size.

11. The method of claim 10, further comprising applying a pressurized atmosphere within the chamber during the sputtering of the substrate at a pressure greater than one atmosphere.

12. The method of claim 10, wherein the substrate voltage magnitude is 200V or less.

13. The method of claim 10, wherein the substrate temperature is about 150° C. and the bias voltage is from about 200V to about 400V.

14. The method of claim 10, wherein the magnetic recording layer is a continuous granular composite (CGC) layer.

* * * * *